United States Patent [19]

Haill et al.

[11] Patent Number: 5,086,271
[45] Date of Patent: Feb. 4, 1992

[54] DRIVER SYSTEM AND DISTRIBUTED TRANSMISSION LINE NETWORK FOR DRIVING DEVICES UNDER TEST

[75] Inventors: Harry K. Haill, Houston; James R. Birchak, Spring; Wai-Leung Hon, Sugarland, all of Tex.

[73] Assignee: Reliability Incorporated, Houston, Tex.

[21] Appl. No.: 464,404

[22] Filed: Jan. 12, 1990

[51] Int. Cl.$^5$ .................... G01R 31/00; G01R 31/02; G01R 1/00

[52] U.S. Cl. .................... 324/158 R; 324/23.1; 324/158 F; 324/707; 333/22 R

[58] Field of Search ............... 324/73.1, 158 R, 158 P, 324/158 F, 73.5, 707, 711, 532, 535, 617; 307/548, 544, 551, 565; 333/22 R; 371/22.1

[56] References Cited

U.S. PATENT DOCUMENTS

| Re. 31,056 | 10/1982 | Chau et al. | 371/22.1 |
|---|---|---|---|
| 2,914,737 | 11/1959 | Tongue . | |
| 3,275,810 | 9/1966 | Moses et al. | 307/540 |
| 3,325,728 | 6/1967 | James et al. | 324/707 |
| 3,922,537 | 11/1975 | Jackson | 371/25.1 |
| 4,044,244 | 8/1977 | Foreman et al. | 371/22.1 |
| 4,143,236 | 3/1979 | Ross et al. | 174/32 |
| 4,157,612 | 6/1979 | Rainal | 29/628 |
| 4,236,246 | 11/1980 | Skilling | 371/27 |
| 4,247,817 | 1/1981 | Heller | 324/73 |
| 4,362,899 | 12/1982 | Borrill | 174/36 |
| 4,374,317 | 2/1983 | Bradshaw | 219/201 |
| 4,411,719 | 10/1983 | Lindberg | 324/158 R |
| 4,418,314 | 11/1983 | Nieto, Jr. | 324/158 P |
| 4,488,299 | 12/1984 | Fellhauer et al. | 371/20 |
| 4,504,696 | 3/1985 | Piper | 174/32 |
| 4,588,970 | 5/1986 | Donecker et al. | 333/22 R |
| 4,622,647 | 11/1986 | Sagnard et al. | 364/580 |
| 4,623,799 | 11/1986 | Nyman, Jr. | 324/73.1 |
| 4,626,804 | 12/1986 | Risher et al. | 333/22 R |
| 4,644,566 | 2/1987 | Verallotti et al. | 375/94 |
| 4,675,562 | 6/1987 | Herlein et al. | 307/602 |
| 4,707,620 | 11/1987 | Sullivan et al. | 307/270 |
| 4,714,875 | 12/1987 | Bailey et al. | 324/73 |
| 4,795,977 | 1/1989 | Frost et al. | 324/158 |
| 4,799,021 | 1/1989 | Cozzi | 324/158 R |
| 4,827,437 | 5/1989 | Blanton | 364/571.01 |
| 4,839,588 | 6/1989 | Janstsch et al. | 324/158 P |
| 4,853,624 | 8/1989 | Rabjohn | 324/158 P |
| 4,866,714 | 9/1989 | Adams et al. | 371/22.1 |
| 4,891,576 | 1/1990 | Jacobs et al. | 324/72.5 |
| 4,900,948 | 2/1990 | Hamilton | 324/73.1 |
| 4,928,062 | 5/1990 | Miles | 324/158 R |
| 4,943,739 | 7/1990 | Slaughter | 333/22 R |

OTHER PUBLICATIONS

"Clock Signal Distribution Network for High Speed Testers" by Ching-Wen Hsue, AT&T Laboratories, Princeton, N.J., 1989 International Test Conference, Paper 8.2, pp. 199-207.

"Coupling Coefficients for Signal Lines Separated by Ground Lines of PC Boards" by J. R. Birchak and H. K. Haill, Reliability Incorporated, Houston, Tex., 1989 International Test Conference, Paper 8.1, pp. 190-198.

"Characteristic Impedance and Coupling Coefficients for Multilayer PC Boards" By J. R. Birchak and H. K. Haill, Reliability Incorporated, Houston, Tex., 1988 International Test Conference, Paper 2.3, pp. 28-38.

"Multilayer PC Board Design Approximations for High Speed Functional Testing" By H. K. Haill and J. R. Birchak, Reliability Incorporated, Houston, Tex., 1987 International Test Conference, Paper 15.1, pp. 354-362.

Primary Examiner—Kenneth A. Wieder
Assistant Examiner—William J. Burns
Attorney, Agent, or Firm—Michael F. Heim

[57] ABSTRACT

A distributed transmission line network for connecting a plurality of DUTs to a low-power driver includes a plurality of distributed transmission lines with distributed capacitors. The distributed capacitors are added to the distributed transmission lines to make the propagation delay on each line equal, thereby eliminating skewed input signals to the DUTs. The capacitors also minimize capacitive cross-talk between the plurality of distributed transmission lines. The distributed transmission line network includes a driver with an internal resistance that is much less than the characteristic impedance of the distributed transmission line to minimize the voltage drop at the driver. The distributed transmission line also includes an input RC network for speeding rise time and a termination RC network for minimizing reflections in the distributed transmission line.

37 Claims, 3 Drawing Sheets

FIG. 2

DRIVER SYSTEM AND DISTRIBUTED TRANSMISSION LINE NETWORK FOR DRIVING DEVICES UNDER TEST

BACKGROUND OF THE INVENTION

The present invention relates generally to apparatus for use in the art of burning-in and testing circuit components prior to their distribution and use, and, more particularly, to a system for driving circuit components during testing. Still more particularly, the present invention is directed to a distributed transmission line network for delivering test signals from a driver to circuit components under test.

According to present practices, integrated circuit ("IC") packages are mass-produced and installed in electronic circuits within highly sophisticated, complex and costly equipment. As with many mass-produced products, IC packages are prone to failure, in many cases at the beginning of operation. The complexity of the equipment within which such packages are installed makes post-installation failures highly undesirable. For example, when equipment reaches the final inspection stage of production, before failures are detected, the high level skills required for testing and repair add a significant cost to production expenses. Even more significantly, when the product has been installed in the field and a service technician must make warranty repairs, the costs thereby incurred can have a significant effect on profitability. As a result, manufacturers of electronic equipment are demanding ever greater quality and dependability in commercial grade IC packages.

Quality and dependability are enhanced substantially by detection of those IC packages likely to fail in the first few hours of operation, prior to installation of the packages in electronic equipment. Virtually all IC packages manufactured today, before they are sold for use in electronic equipment, are tested or "burned-in" for a predetermined period of time to detect IC packages that are defective or otherwise liable to fail prematurely. The burn-in process includes (1) placing the IC packages in sockets arranged in arrays on printed circuit boards ("burn-in boards"); (2) placing the burn-in boards with the packages, or devices under test ("DUTs"), mounted thereon in a chamber whose environment, particularly temperature, is controllable; (3) applying direct current (dc) biases to each package on each board in such a manner as to forward and reverse bias as many of the package's junctions as possible, and/or actively clocking each package to its maximum rated conditions, such application of dc biases and clock signals being accomplished substantially simultaneously to each package; (4) removing the burn-in boards from the chamber after the IC packages have been subjected to the environmental condition of the chamber and the biases and clock signals for a designated period of time; and (5) removing the IC packages from the burn-in boards. The present invention focuses primarily on step (3), which may also include the application of test signals to the DUTs.

A conventional burn-in board includes a plurality of sockets arranged in rows and columns. Signal lines, or traces etched onto the printed circuit card comprising the burn-in board, connect each pin of each socket to a tab on the connector edge of the board. Typically, the corresponding pins from each socket on each burn-in board are connected in parallel.

A conventional burn-in system or burn-in and test system includes an environmental chamber having means for receiving a plurality of burn-in boards. The connector edge on each burn-in board is received within an edge connector, generally outside the burn-in chamber. The edge connector may be attached to a second printed circuit card, or driver board, or it may be attached to a printed circuit backplane assembly, which also has edge connectors for receiving driver boards, as shown and described in U.S. Pat. No. 4,374,317.

The driver boards generate digital signals for exercising and testing the DUTs on the burn-in boards within the burn-in chamber. The digital signals are propagated through the edge connector and along parallel transmission lines on the burn-in board to the target pin on each DUT. This use of a parallel network of parallel signal lines to connect DUTs to drivers causes certain problems.

Each DUT on a burn-in board is a capacitive load that must be charged by the corresponding drivers. Similarly, the parallel signal lines connecting the drivers to the DUTs include capacitance that must be charged by the drivers. Thus, the use of a network of parallel signal lines to drive the DUTs means that the drivers must have sufficient power capability to deliver the current necessary to charge the capacitive load represented by each DUT and each signal line. One problem, therefore, with prior art burn-in systems is the need for relatively powerful drivers. Therefore, it would be desirable to develop a suitable signal line network employing a low-power driver capable of driving DUTs at high frequencies (above 1 megahertz).

Perhaps the most efficient low power, high frequency transmission line network, at least in theory, includes a single transmission line for each driver, with DUTs connected in series along the transmission line in a so-called "daisy chain." Significant difficulties in implementing such a network, however, have prevented its use thus far in connection with a burn-in chamber.

Two of the more significant problems are improper timing of input signals caused by propagation delay and signal distortion due to reflection. See Ching-Wen Hsue, "Clock Signal Distribution Network for High Speed Testers," 1989 International Test Conference, paper 8.2, pages 199-207. Propagation delay arises from a number of factors, but is more frequently a concern as the length of signal lines increases. Thus, using long signal lines may mean that the digital signals propagated along those lines will not arrive simultaneously at each DUT.

Most DUTs have a plurality of input terminals necessitating a plurality of digital input signals. For example, a DUT with 32 pins may require input signals at numerous input terminals, such as the clock input, the data inputs, the address inputs the enable input, and the reset input, each of which is connected to a separate driver. To test such a DUT properly, the digital signals at each of these terminals must arrive in a properly coordinated sequence. If the signals do not arrive in a properly coordinated sequence at each input terminal (a condition referred to as "signal skew"), the DUT will not be exercised in accordance with the desired test pattern, and the results of the test will be meaningless. Furthermore, as the frequency of the digital signals increases, the effect of skew becomes proportionately greater. Thus, any new transmission network employing transmission lines to connect DUTs sequentially must account for the problem of signal skew as a consequence of propagation delays in the transmission lines.

Reflection occurs when the original test signal spawns reflected signals on the transmission line. Reflection of the test signal arises because of impedance discontinuities in the transmission line. A reflected test signal causes waveshape distortion of subsequent digital signals as they propagate along the transmission line.

Signal distortion may also be caused by cross-talk between transmission lines. Because the transmission lines are located within a close proximity of each other, capacitive and/or inductive coupling between adjacent signal lines may cause interference known as cross-talk.

Conventional wisdom in the burn-in industry teaches that so-called "daisy chain" distribution of signals from drivers to DUTs is not feasible. It would be advantageous to develop a suitable signal distribution network capable of employing low-power drivers operating at high frequencies.

SUMMARY OF THE INVENTION

Accordingly, there is provided a system for connecting DUT's to a driver, comprising the use of a plurality of long distributed transmission line networks linking each driver to a plurality of DUT's distributed along each transmission line network. In this manner, the capacitance represented by each DUT can be charged successively rather than simultaneously, and the driver need not be capable of delivering the substantial power needed to charge all capacitances at once. By adding distributed capacitance at key points along the distributed transmission line network, propagation delays can be introduced into the distributed transmission line to coordinate the timing among the plurality of distributed transmission lines connected to different drivers.

The present invention provides a distributed transmission line network which can provide high frequency test signals with very fast rise times to a plurality of DUT's from a single low-power driver. The distributed transmission line network minimizes cross-talk between current paths on the circuit board, while controlling the rise and fall times and the voltage level of the test signals. The plurality of distributed transmission lines connect sequentially to a plurality of DUT's. Each distributed transmission line connects to the same input terminal of each of the plurality of DUT's, thus providing the same signal, with a predetermined propagation delay, to the same input terminal of a plurality of DUT's.

The driver system preferably includes a driver with a low internal resistance, which reduces the voltage drop across the driver. The distributed transmission line network constructed in accordance with the principles of the present invention also includes a front end termination circuit, which comprises a series RC circuit. The front end termination circuit provides a voltage overshoot, which compensates for the voltage drop in the test signal caused by the internal resistance in the driver and adds resistive damping to reduce ringing.

The distributed transmission line network also includes distributed discrete capacitances positioned along the length of the distributed transmission line to control the amount of propagation delay that occurs in each individual distributed transmission line. Proper selection of the distributed capacitances makes the propagation delay on all distributed transmission lines equal so that the test signals arrive simultaneously to all the input terminals of a particular DUT, thereby eliminating skewed input signals. The distributed capacitances also reduce capacitive cross-talk between the plurality of distributed transmission lines.

In addition, the distributed transmission line network includes a far end termination circuit for minimizing reflections on the distributed transmission line. The far end termination circuit consists of an RC circuit connected to ground, which approximately matches the impedance of the distributed transmission line.

These and various other characteristics and advantages of the present invention will become apparent to those skilled in the art upon reading the following detailed description.

BRIEF DESCRIPTION OF THE DRAWINGS

For a detailed description of the preferred embodiment of the invention, reference will be made now to the accompanying drawings, wherein:

FIG. 2 is a layout of a driver board and burn-in board configuration constructed in accordance with the principles of the invention;

DETAILED DESCRIPTION OF THE DRAWINGS

"Burn-in" refers generally to any one of several techniques whereby integrated circuit ("IC") packages are stressed within their physical and electrical limits prior to their sale or distribution so that those packages likely to become early failures in completed equipment can be discovered. The burn-in techniques include (1) loading the IC packages into sockets on burn-in boards; (2) placing the burn-in boards in a chamber whose environment, particularly temperature, is controllable; (3) applying electrical signals to the boards while subjecting the IC packages to the maximum temperature rating therefor (in some cases), monitoring the signals (in some cases), functionally testing the IC packages (in some cases); (4) removing the burn-in boards from the chamber; and (5) unloading the IC packages from the burn-in boards. The present invention focuses on the third step and presents an improved driver system and distributed transmission line network for delivering signals to the devices under test ("DUTs").

A typical IC package or DUT, as are referred to herein, comprises a dual in-line package ("DIP") having a body portion which is generally a parallelpiped with from four to sixty-four electrical leads or terminals with a generally L-shaped cros-ssection extending out and down from the opposing sides of the body. The overall width of the DIP may be, for example, 0.3, 0.4 or 0.6 inch. Sockets mounted on the burn-in board include socket contacts defining slots for receiving electrical leads on DIPs.

Unless specified otherwise herein, the terms IC package and DUT may also refer to a surface mounted device (a "chip carrier") including small outline integrated circuits (SOICs), plastic leaded chip carriers (PLCCs), ceramic leaded chip carriers (CLCCs), leadless chip carriers (LCCs), pin grid arrays (PGAs) or any other circuit made by processing semiconductor material.

Figure 1:
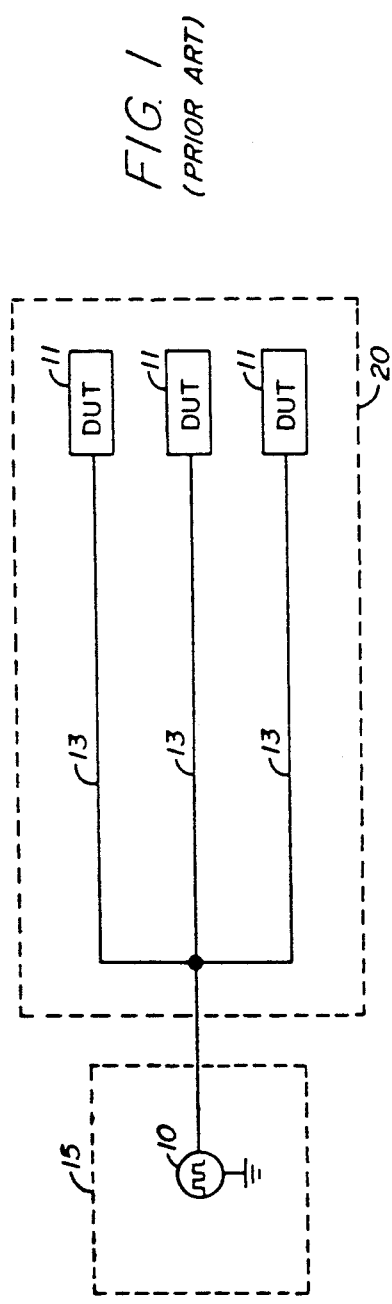
FIG. 1 illustrates schematically the prior art transmission line network for connecting devices under test on the burn-in board to drivers on the driver board.

In a conventional burn-in system integrated with a burn-in chamber, as shown in FIG. 1, the IC packages or DUTs are connected directly to the drivers 10, with all DUTs 11 arranged on parallel transmission lines 13, so that the signal generated by a particular driver 10 reaches each individual DUT substantially simultaneously. Parallel transmission lines, however, require a high-power driver to drive the DUTs.

Figure 2:
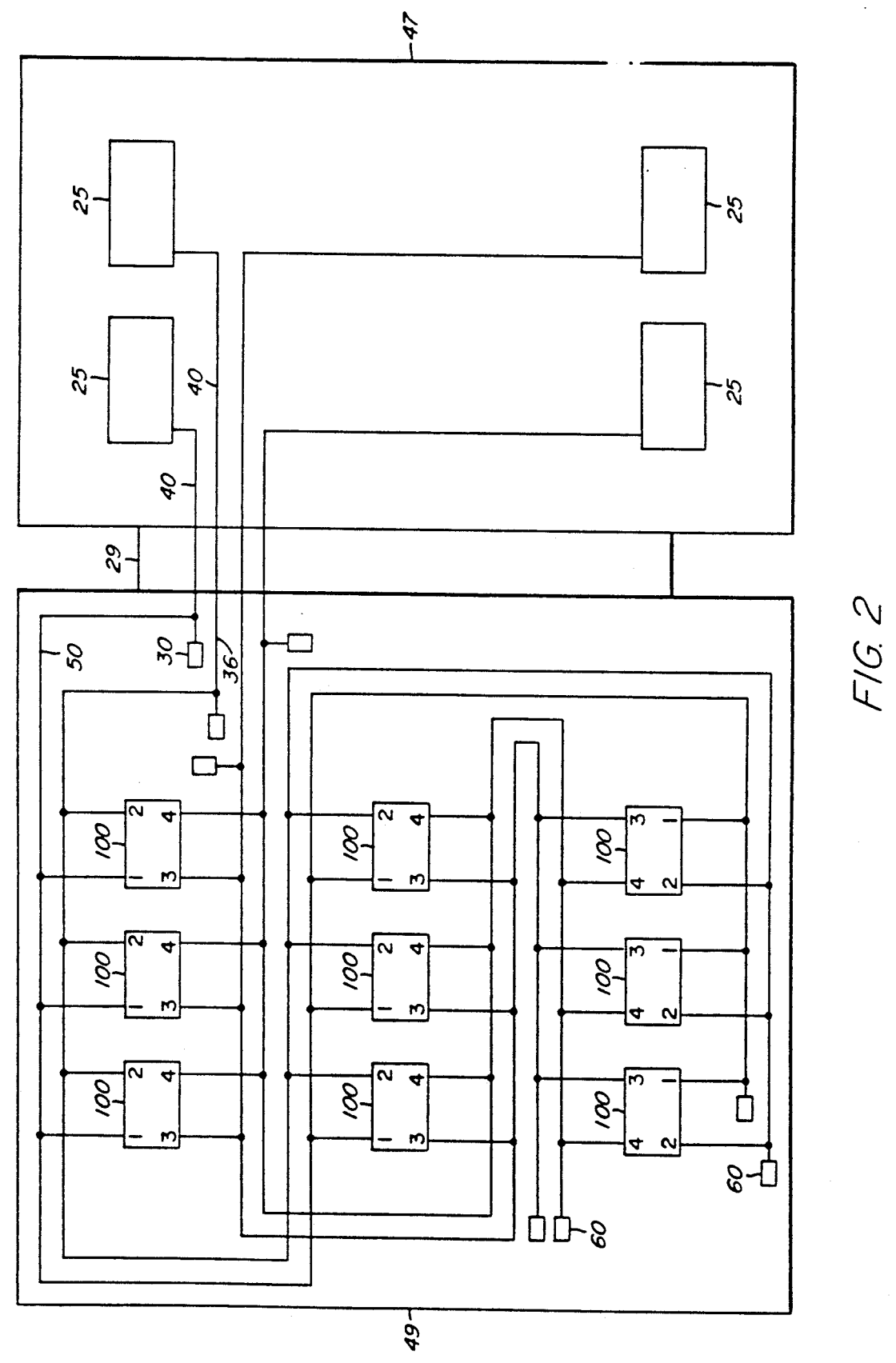

Referring now to FIG. 2, the driver system of the present invention preferably includes a plurality of driver circuits 25 on a driver printed circuit board 47 providing digital electrical signals to a plurality of DUTs 100 on a burn-in board 49. According to conventional techniques, the driver board 47 includes a plurality of signal lines 40, which terminate in a driver board edge connector 29.

The burn-in board 49 includes a connector edge 36, which is received within the driver board connector 29, and a plurality of signal lines, comprising distributed transmission line networks 50, which provide electrical connections between the connector edge 36 and the DUTs 100. For purposes of explaining the preferred embodiment of the invention, the DUTs 100 shown in FIG. 2 are depicted as having four pins. It will be understood by one skilled in the art that the same principles described herein can be extended to DUTs having any number of pins.

The number of pins on any particular DUT varies depending on the type of device being burned-in or tested. Each type of device requires different signals delivered to each of its pins in a coordinated sequence in order to operate that device in its intended manner. Thus, the signal at each pin, typically, must be generated by a different driver, and the signals generated by different drivers must be coordinated with one another to cause the device to operate.

Each of the DUTs 100 includes four input terminals (labelled 1,2,3,4 on FIG. 2), each of which receives a signal from one of the drivers 25. According to the preferred embodiment, one distributed transmission line network 50 connects to each DUT 10 on the burn-in board 49, providing the same signal to the same input terminal of each DUT. In some cases, depending on the length of the signals lines and the frequency of operation, it may be necessary to employ more than one distributed transmission line and to divide the DUTs 100 among the transmission lines employed. The number of distributed transmission line networks 50 therefore preferably equals the number of drivers necessary to exercise or test the DUTs 100. For purposes of explanation, as shown in FIG. 3, four distributed transmission line networks provide digital signals to DUTs with four input terminals.

Figure 3:
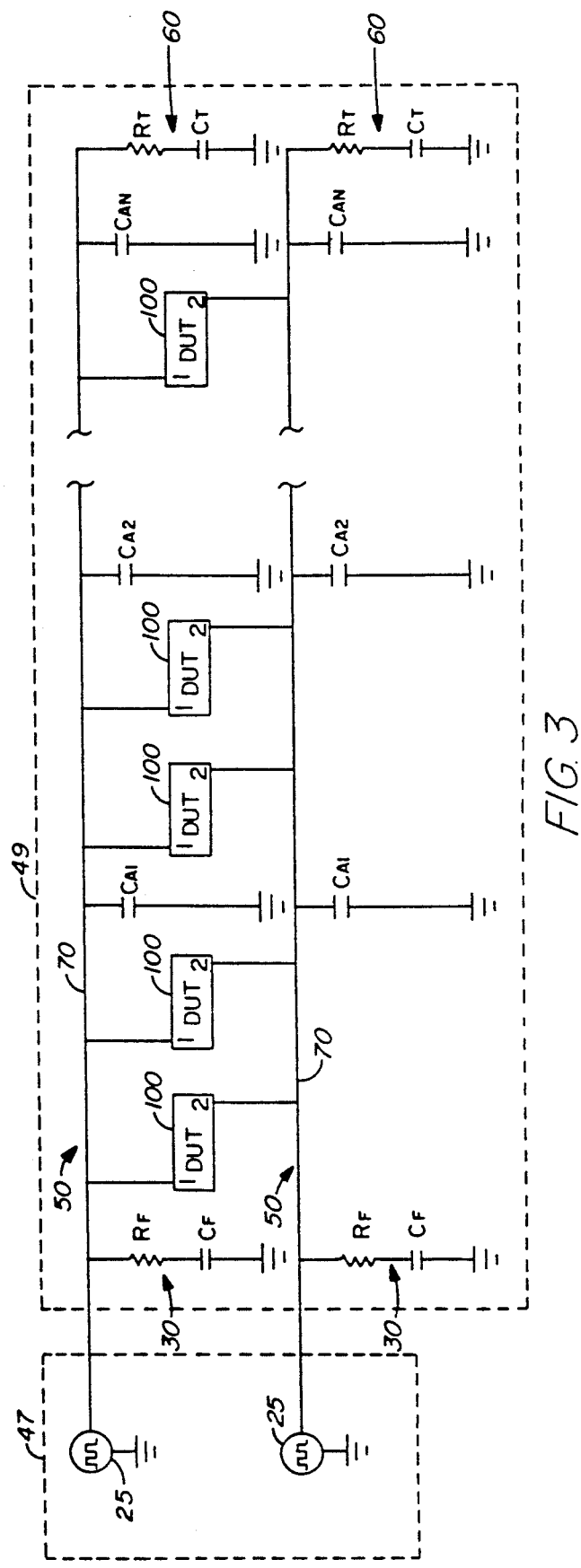
FIG. 3 illustrates schematically the preferred embodiment of the driver system and distributed transmission line network shown in FIG. 2.

Referring now to FIG. 3, two of the distributed drivers 25 and two of the transmission lines 50 shown in FIG. 2 are depicted schematically in connection with the plurality of DUTs 100. As noted above, it should be understood that many more drivers and associated distributed transmission lines may be necessary to provide signals to other pins on each DUT. The drivers 25 each generate a digital signal that is transmitted to the same input terminal of each DUT. The requirements of the drivers 25 are discussed below in relation to FIG. 4.

Each of the transmission line networks 50 on the burn-in boards 49 preferably comprises an electrical conductor 70, an input RC network 30, a plurality of distributed capacitors, $C_{A1}, C_{A2} \ldots C_{AN}$ (collectively referred to as CA), and a termination network 60.

The electrical conductor 70 preferably comprises a single conductor with a length that typically runs up to several feet. The electrical conductor 70 may be formed by conventional etching techniques on a printed circuit board.

The input RC network 30 connects to the connector edge end of the transmission line network 50. The input network 30 provides a high capacitive load and includes a resistor, $R_F$, in series with a capacitor, $C_F$, connected between the electrical conductor 70 and ground.

The DUTs 100 connect to the electrical conductor 70 at discrete points along the transmission line network 50. Conductor 70 connects electrically to the same input terminal of each of the DUTs 100, thereby providing the same signal, to the same input terminal, of each DUT 100.

The distributed capacitors, $C_{A1}, C_{A2} \ldots C_{AN}$ are located at discrete points along the distributed transmission line network 50. The distributed capacitors $C_{A1}, C_{A2} \ldots C_{AN}$ connect the electrical conductor 70 to ground. As will be discussed more fully below in relation to FIG. 4, the distributed capacitors, $C_A$, are used to equalize the propagation delay on each distributed transmission line 50. The distributed capacitors, $C_A$, also serve to diminish cross-talk between adjacent transmission line networks 50.

The termination network 60 includes a resistor, RT, in series with a capacitor, $C_T$ connected between the terminal end of the electrical conductor 70 and ground. The termination network 60 minimizes reflection in the distributed transmission line network 50.

Figure 4:
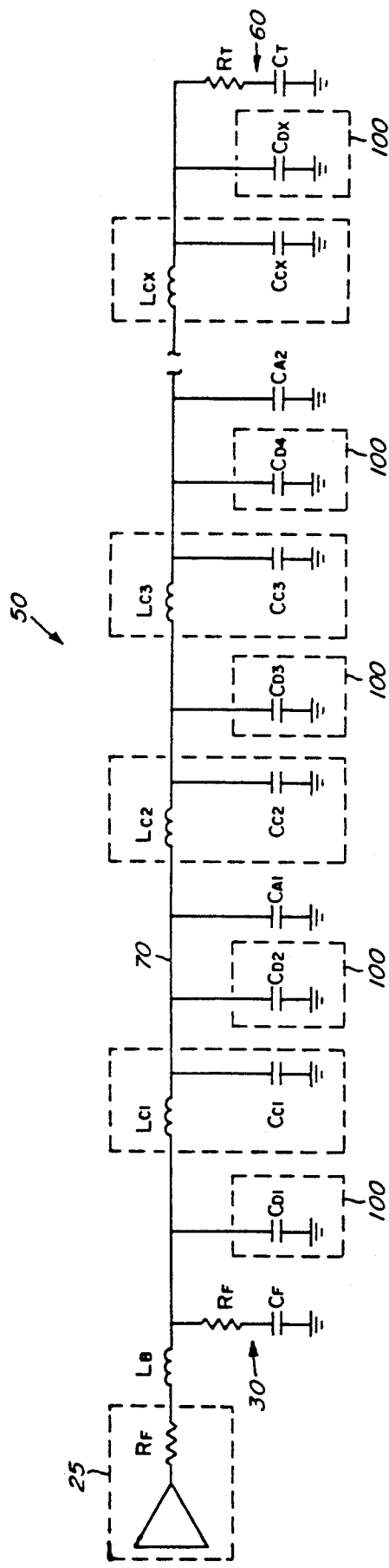
FIG. 4 shows an equivalent circuit diagram of the driver system and distributed transmission line network of FIG. 3.

The equivalent circuit diagram of a single driver system and its associated distributed transmission line network is shown in FIG. 4. As shown in FIG. 4, each of the DUTs 100, and its accompanying socket, may be represented as a capacitance to ground $C_D$. In addition, the electrical conductor 70 between the DUT's may be represented as a series inductor, $L_C$, with a capacitor $C_C$ to ground. The signal lines on the driver board 25 give rise to an inductance, which is represented as a series inductor $L_B$.

The driver 25 generates a signal that is transmitted to the DUTs 100. As shown in the equivalent circuit diagram of FIG. 4, the driver 25 includes an internal resistance, $R_I$. Selection of a driver with a minimum internal resistance, $R_I$, is preferred for proper operation of the invention.

The internal resistance, $R_I$, of the driver 25 causes a difference between the initial value of the input signal and final value of the input signal, at the input end of the distributed transmission line network. The voltage drop across the driver caused by its internal resistance remains constant until all of the capacitances in the distributed transmission line network have charged. When all of the capacitances in the distributed transmission line network have charged, the voltage drop across the transmission line network will float up to the output voltage of the driver $V_{OH}$. By keeping the voltage drop across the driver at a minimum, the subsequent increase in voltage across the distributed transmission line network, as the capacitances on the network charge, is minimal.

If the input signal generated by the driver 25 is treated as a step signal, with an initial voltage of zero volts and a peak voltage of E volts, then the initial value of the input signal, $V_i$, at the input end of the distributed transmission line network may be calculated as follows:

$$V_i = (E \times Z_D)/(R_I + Z_D); \quad (1)$$

where $Z_D$ is the characteristic impedance of the distributed transmission line as defined below in formula (4).

The peak voltage of the input signal, $V_f$, is:

$$V_f = E. \quad (2)$$

To minimize the voltage fluctuation at the input end of the distributed transmission line network, the internal resistance $R_I$ must be much smaller than the magnitude of the characteristic impedance $Z_D$. As $R_I$ in formula (1) approaches zero, the initial voltage, $V_i$, approaches the peak voltage, $V_f$. To keep the magnitude of the voltage fluctuation below ten percent of the original signal, the internal resistance $R_I$ must be less than $Z_D/10$, as follows:

$$R_I < Z_D/10$$

In the preferred embodiment, the driver 25 is selected to maintain the magnitude of the reflected signal to less than 5% of the original signal. This is done by selecting a driver 25 with an internal resistance $R_I$, which is more than twenty times smaller than the resistance of the characteristic impedance $Z_D$:

$$R_I < Z_D/20. \quad (3)$$

The characteristic impedance of the distributed transmission line network $Z_D$ may be calculated as follows:

$$Z_D = Z_O/\sqrt{1 + (C_S/C_C)} \quad (4)$$

where $$Z_O = \sqrt{L_C/C_C}; \quad (5)$$

$L_C$ is the inductance of the electrical conductor 70, found by adding $L_{C1}, L_{C2}, \ldots L_{CX}$, as follows:

$$L_C = \Sigma L_{Ci} \text{ (where i = 1 to X)};$$

$C_C$ is the capacitance to ground of the burn-in board electrical conductor 70 found by adding $C_{C1}, C_{C2} \ldots C_{CX}$, as follows:

$$C_C = \Sigma C_{Ci} \text{ (where i = 1 to X)};$$

$C_S$ is the total capacitance from adding the capacitance of the DUTs and sockets, $C_D$, to the distributed capacitance, $C_A$, as follows:

$$C_S = C_D + C_A;$$

$C_D$ is the total capacitance from the DUTs and sockets and may be found by adding $C_{D1}, C_{D2} \ldots C_{DX}$, as follows:

$$C_D = \Sigma C_{Di} \text{ (where i = 1 to X)};$$

$C_A$ is the total distributed capacitance found by adding $C_{A1}, C_{A2} \ldots C_{AN}$, as follows:

$$C_A = \Sigma C_{Ai} \text{ (where i = 1 to N)}.$$

Referring again to FIG. 4, electrical signals propagate from the driver 25 along the signal lines on the driver board and through the edge connector on the driver board onto the burn-in board. This portion of the driver system may be represented as a transmission line with an inductance, $L_B$.

The input RC network 30 marks the beginning of the distributed transmission line 50. In the preferred embodiment, the input RC network 30 is formed by conventional techniques on the burn-in board.

The input RC network 30 preferably comprises resistive/capacitive load, which, together with the inductance, $L_B$, from the driver board signal line, compensates for the effects of the voltage drop at the driver, $V_R$. The RC network causes a slight overshoot in the voltage of the driver output signal on the distributed transmission line network 50. Thus, the input RC network 30 raises the voltage of the signal entering the distributed transmission line network to the desired level. In addition, the resistor, $R_F$, provides damping to prevent ringing of the L-R-C circuit.

Figure 5:
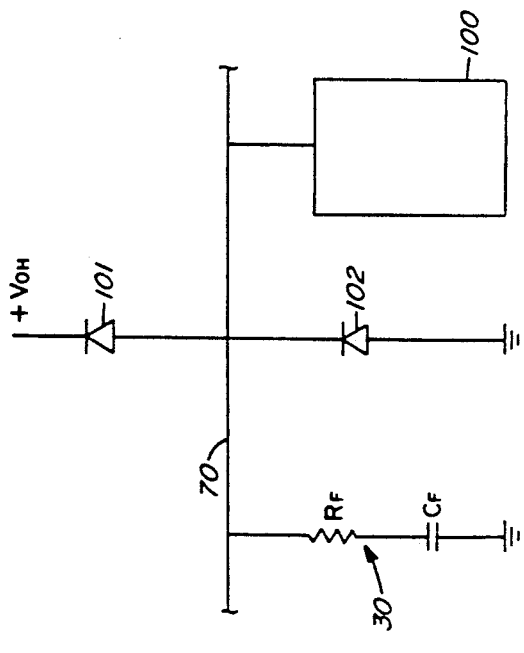
FIG. 5 illustrates schematically an alternative embodiment of an input network for the distributed transmission line of FIG. 3.

In an alternative embodiment shown in FIG. 5, two Schottky diodes or clamping diodes 101, 102 may be added to the RC network 30, one between the electrical conductor 70 and a dc bias voltage, $V_{OH}$, and one between conductor 70 and ground. Diodes 101, 102 prevent any excessive overshoot in the voltage of the signal. The dc bias voltage $V_{OH}$ is chosen to be the same as the voltage output of the driver 25. Thus, diode 101 prevents the voltage of the input signal from exceeding the voltage output $V_{OH}$ of the driver. Diode 102 clamps to ground, thereby preventing the voltage of the input signal from being less than zero.

As noted above, the DUTs 100 and corresponding sockets present to the distributed transmission line network 50 a capacitive load to ground. In the equivalent circuit diagram shown in FIG. 4, these capacitive loads are shown as capacitors, $C_D$.

Similarly, the electrical conductor 70 between the DUTs 100 gives an inductive and capacitive effect. In the equivalent circuit diagram of FIG. 4, these inductive and capacitive effects are shown as inductors $L_C$ and capacitors $C_C$. The capacitive values of the DUTs 100 and sockets $C_D$ and the capacitive values of the electrical conductor $C_C$ can be measured using conventional techniques, as can the inductance value of the electrical conductor $L_C$. The values of $L_C$, $C_C$ and $C_D$ can also be determined as set forth in the following publications: J. R. Birchak and H. K. Haill, "Coupling Coefficients for Signal Lines separated by Ground Lines on PC Boards," 1989 International Test Conference, paper 8.1, pages 190–198; J. R. Birchak and H. K. Haill, "Characteristic Impedance and Coupling Coefficients for Multilayer PC Boards," 1988 International Test Conference, paper 2.3, pages 28–38; H. K. Haill and J. R. Birchak, "Multilayer PC Board Design Approximations for High Speed Functional Testing," 1987 International Test Conference, paper 15.1, pages 354–362.

As noted above, it is essential to the proper operation of the burn-in system that all signals on the plurality of distributed transmission line networks arrive substantially simultaneously at each DUT 100. The period of time required for a signal to travel between any two points on a signal line, commonly called the propagation delay, $t_{pd}$, varies directly with the length of the signal line therebetween. Capacitance in the signal line also increases the propagation delay.

The propagation delay, $t_{pd}$, on each transmission line may be calculated as follows:

$$t_{pd} = t_{pd0}\sqrt{1 + (C_S/C_C)} \ ; \tag{6}$$

where $$t_{pd0} = \sqrt{L_C C_C} \ ; \tag{7}$$

and the values of $L_C$, $C_C$ and $C_S$ are the same as defined above in relation to formulas (4) and (5).

The propagation delay, $t_{pd}$, for each distributed transmission line network is compared to find the line with the longest propagation delay. This value for the propagation delay $t_{pd}$ then is inserted in formula (6) above and the total capacitance, $C_S$ is treated as a variable. Formula (6) then is solved to determine the total capacitance, $C_S$, necessary on each distributed transmission line to make the propagation delay on that line equal to the propagation delay for the slowest distributed transmission line. Once $C_S$ is determined, the capacitance which must be added as distributed capacitance, $C_A$, can be found by subtracting the capacitance due to the DUTs and sockets, $C_D$, from the total capacitance $C_S$:

$$C_A = C_S - C_D. \tag{8}$$

Small distributed capacitors, $C_A$ in FIG. 4, then are added along the transmission line as required.

The preferred number of distributed capacitors, $C_A$, required be determined as follows:

$$N \text{ (number of distributed capacitors)} \geq 10 \times t_{pd}/t_r; \tag{9}$$

where $t_{pd}$ is the propagation delay calculated above and $t_r$ is the rise time of the input signal on the distributed transmission line. In the preferred embodiment, the rise time $t_r$ of the input signal is defined as the time period that it takes for the input signal to go from ten percent (10%) to ninety percent (90%) of its total voltage.

Thus, the total capacitance to be added as distributed capacitance $C_A$ is known, as are the number of capacitors N to add. Dividing the total calculated distributed capacitance $C_A$ by the number of distributed capacitors N gives the required capacitance for each discrete capacitor $C_{A1}$, $C_{A2}$, ... $C_{AN}$. In the preferred embodiment, the capacitors then are distributed evenly throughout the distributed transmission line network. The distributed capacitors $C_{A1}$, $C_{A2}$, ... $C_{AN}$ also function as shunt capacitors to minimize cross-talk interference between the plurality of distributed transmission line networks.

The termination network 60 connects to the end of the distributed transmission line network and includes a resistor, $R_T$, in series with a capacitor, $C_T$, connected between the terminal end of the electrical conductor 70 and ground. The termination network 60 matches the characteristic impedance of the distributed transmission line network to minimize reflections. Thus, the resistor, $R_T$, should approximately equal the characteristic impedance of the distributed line $Z_D$. That is, $$R_T \approx Z_D. \tag{10}$$

The capacitance, $C_T$, preferably is large to minimize the voltage swing on the capacitor during the rise and fall times of the signals on the transmission line. Thus, $$2.2 \ (R_T)(C_T) > > t_r \text{ (rise time).} \tag{11}$$

In the preferred embodiment, $$2.2 \ (R_T)(C_T) \approx 100 \ (t_r).$$

Alternatively, $C_T$ can be given a somewhat smaller value to create an overshoot in the voltage of the signal on the conductor 70 to compensate partially for voltage drops that occur due to electrical resistance in the electrical conductor 70. This is particularly useful at high frequency (fast rise times), where the skin effect of the electrical conductor becomes a significant factor in determining the electrical resistance of the distributed transmission line network.

While a preferred embodiment of the invention has been shown and described, modifications can be made by one skilled in the art without departing from the principles of the present invention.

What is claimed is:

1. Burn-in apparatus, comprising:
   a chamber;
   means within said chamber for supporting a plurality of burn-in boards, each burn-in board being capable of supporting a plurality of IC packages;
   means for controlling the environment within said chamber; and
   means for communicating digital electrical signals to the IC packages on the burn-in boards within said chamber, said communicating means including
   a plurality of means for generating digital electrical signals;
   at least one transmission line for each said generating means, each said transmission line connecting one generating means sequentially to a plurality of IC packages;
   wherein the transmission line includes distributed capacitance.

2. Burn-in apparatus according to claim 1, wherein the distributed capacitance comprises discrete capacitors distributed along said transmission line, whereby the propagation delays for each transmission line connected to the same IC package are substantially the same.

3. Burn-in apparatus according to claim 2, wherein the number of capacitors distributed along said transmission line is greater than or equal to ten times the propagation delay divided by the rise time of the input signal.

4. Burn-in apparatus according to claim 1, wherein the internal resistance of said generating means is less than approximately ten percent of the characteristic impedance of the transmission line connected thereto.

5. Burn-in apparatus according to claim 1, further comprising an RC network connected between the input end of each transmission line and ground, causing a slightly damped voltage overshoot in the digital electrical signals generated by said generating means.

6. Burn-in apparatus according to claim 1, further comprising an RC network connected between the terminal end of each transmission line and ground, wherein the resistance of said network approximately equals the characteristic impedance of the transmission line.

7. Burn-in apparatus according to claim 6, wherein the time constant of the terminal RC network is substantially longer than the rise time of the digital electrical signals propagated along the transmission line.

8. Burn-in apparatus according to claim 7, wherein the time constant of the terminal RC network is more than one hundred times longer than the rise time of the digital electrical signals propagated along the transmission lines.

9. Burn-in apparatus according to claim 6, wherein the terminal RC network causes a voltage overshoot in the digital electrical signals propagated along the transmission line to compensate for voltage drops along the transmission line.

10. A system for providing test signals to a plurality of DUTs, comprising:
  means for generating the test signals;
  a distributed transmission line with a distributed capacitance connected sequentially to the plurality of DUTs, wherein said distributed transmission line receives the test signals from said generating means, and transmits the test signals to said DUTs.

11. A system as in claim 10, wherein the DUTs each include a plurality of input terminals, and said distributed transmission line connects to the same input of each DUT, thereby providing the same test signal to the same terminal of each DUT.

12. A system as in claim 11, further comprising a plurality of distributed transmission lines, each of which is connected to a different input terminal of the DUTs, and a plurality of generating means wherein one distributed transmission line is associated with one generating means.

13. A system as in claim 12, wherein each of said distributed transmission lines has a different propagation delay associated therewith, and distributed capacitors are added as necessary to each of said distributed transmission lines to make the propagation delay equal on each distributed transmission line.

14. A system as in claim 10, wherein said generating means includes an internal resistance $R_I$, and said distributed transmission line includes a characteristic impedance, $Z_D$; and the internal resistance, $R_I$, of said generating means is less than the characteristic impedance $Z_D$, of said distributed transmission line.

15. A system as in claim 14, wherein a voltage drop in the test signal occurs at the internal resistance of the generating means, and said distributed transmission line includes an input network for increasing the voltage of the test signal to compensate for the voltage drop at the internal resistance.

16. A system as in claim 14, wherein the input network includes a resistor connected in series between the distributed transmission line and ground.

17. A system as in claim 16, wherein the input network also includes two clamping diodes, the first of which is connected between the distributed transmission line and ground, and the second of which is connected between the distributed transmission line and a dc voltage supply.

18. A system as in claim 10, wherein the distributed transmission line includes a termination network for minimizing reflections in the system.

19. A system as in claim 18, wherein the termination network comprises a resistor in series with a capacitor connected between the distributed transmission line and ground.

20. A system as in claim 19, wherein the resistor has a magnitude approximately equal to the characteristic impedance, $Z_D$.

21. A distributed transmission line network for providing test signals to devices under test, comprising:
  a driver for generating a test signal;
  an input RC network, connected to the output of the driver;
  a transmission line, with distributed capacitance, said transmission line connected to said input RC network;
  an output RC network, connected to said transmission line; and
  wherein said driver has an internal resistance which is less than approximately ten percent of the impedance of the transmission line.

22. A distributed transmission line network as in claim 21, wherein aid input RC network increases the initial amplitude of the test signal.

23. A distributed transmission line network as in claim 21, wherein the transmission line includes discrete capacitors distributed along said transmission line.

24. A transmission line network as in claim 23, wherein said capacitors reduce cross-talk.

25. A transmission line network as in claim 23, wherein said capacitors are added to said transmission line to control the propagation delay on the transmission line.

26. A transmission line network as in claim 25, wherein the number of capacitors distributed along said transmission line is greater than approximately five times the propagation delay divided by the rise time of the test signal.

27. A distributed transmission line network as in claim 21, wherein said output RC network minimizes signal reflection.

28. A system for providing test signals to devices under test, comprising:
  a plurality of drivers for providing a plurality of test signals;
  a plurality of transmission lines connected in series to the devices under test, wherein one of said plurality of transmission lines transmits one of the plurality of test signals from one of the plurality of drivers to the devices under test;
  said transmission line including a number of capacitors distributed along the transmission line for reducing cross-talk between the plurality of transmission lines.

29. A system as in claim 28, wherein said distributed capacitors also control the propagation delay on each one of said plurality of transmission lines.

30. A system as in claim 29, wherein the number of capacitors added to each individual one of said plurality of transmission lines is selected to make the propagation delay on each one of said plurality of transmission lines substantially equal.

31. A system as in claim 30, wherein the number of capacitance selected on each of said plurality of transmission lines is greater than or equal to ten times the propagation delay of the transmission line, divided by the rise time of the associated test signal transmitted on that respective transmission line.

32. A distributed transmission line network for maintaining the uniformity of a test signal along the length of a transmission line connected in series to devices under test, comprising:
- a driver for generating the test signal;
- an input RC network connected to the output of the driver and to said transmission line for increasing the initial amplitude of the test signal; and
- an output RC network connected to said transmission line for minimizing signal reflections.

33. A distributed transmission line network as in claim 32, wherein capacitors are distributed along the length of the transmission line for controlling the propagation delay of the transmission line.

34. A method for equalizing the propagation delay along a plurality of transmission lines, wherein the transmission lines provide test signals from a plurality of drivers to devices under test, comprising the steps of:
   (a) measuring the inductance of each transmission line;
   (b) measuring the capacitance of each transmission line;
   (c) measuring the capacitance represented by each device under test;
   (d) calculating the propagation delay of each transmission line using the values obtained in steps (a), (b), and (c);
   (e) determining which transmission line has the longest propagation delay;
   (f) determining the amount of capacitance present in the transmission line found in step (e); and
   (g) adding distributed capacitance to all transmission lines, except the transmission line determined in step (e), to provide an equal amount of capacitance on all of the transmission lines thereby equalizing the propagation delay on each transmission line.

35. A method as in claim 34, further comprising the steps of;
   (h) determining the rise time of the test signal on each transmission line; and
   (i) calculating the number of capacitors to add to each transmission line based on the propagation delay and on the rise time of the test signal.

36. A method as in claim 35, further comprising the steps of;
   (j) calculating the characteristic impedance of the transmission lines; and
   (k) providing a termination RC network on each transmission line in which the resistor in the RC network has a resistance that is approximately equal to the characteristic impedance of that respective transmission line, as found in step (j).

37. A method as in claim 36, further comprising the steps of;
   (l) determining the internal resistance of the plurality of drivers;
   (m) finding the peak value of the test signal on each respective transmission line;
   (n) calculating the initial value of the test signal on each transmission line, based on the values obtained in steps (j), (l) and (m); and
   (o) providing an input RC network on each transmission line wherein the capacitance values are chosen to provide a voltage overshoot to compensate for the difference between the peak value of the test signal, as found in step (m), and the initial value of the test signal, as found in step (n), and the resistance values are chosen to prevent signal reflection caused by the voltage overshoot.

* * * * *